United States Patent [19]

Kumon

[11] 3,970,879

[45] July 20, 1976

[54] PIEZOELECTRIC ACOUSTIC DEVICE

[75] Inventor: Osamu Kumon, Itami, Japan

[73] Assignee: Sumitomo Electric Industries, Ltd., Osaka, Japan

[22] Filed: Dec. 29, 1972

[21] Appl. No.: 319,819

[30] Foreign Application Priority Data

Dec. 29, 1971 Japan ........................ 47-003782[U]
Sept. 26, 1972 Japan ........................ 47-112143[U]

[52] U.S. Cl. .................................. 310/9.1; 310/8.2; 310/8.5; 179/110 A; 340/8 FT

[51] Int. Cl.² .......................................... H01L 41/04

[58] Field of Search ............... 310/8.2, 8.5, 8.6, 9.1, 310/9.4; 340/10, 8 FT; 179/110 A

[56] References Cited

UNITED STATES PATENTS

| | | | |
|---|---|---|---|
| 2,753,543 | 7/1956 | Rymes | 340/8 FT |
| 3,114,848 | 12/1963 | Kritz | 310/9.1 |
| 3,325,779 | 6/1967 | Supernaw et al. | 340/10 X |
| 3,331,970 | 7/1967 | Dundon | 310/9.1 |
| 3,497,731 | 2/1970 | Straube | 310/8.5 X |
| 3,704,385 | 11/1972 | Schweitzer et al. | 310/8.2 |
| 3,708,702 | 1/1973 | Brunnert | 310/8.2 |
| 3,742,442 | 6/1973 | Leyde et al. | 310/9.1 X |
| 3,761,956 | 9/1973 | Takahashi et al. | 310/9.1 X |

*Primary Examiner*—Mark O. Budd
*Attorney, Agent, or Firm*—Sughrue, Rothwell, Mion, Zinn & Macpeak

[57] ABSTRACT

This invention relates to improvements of a piezoelectric acoustic device used for a warning buzzer, general buzzer, etc. The conventional piezoelectric acoustic device generates relatively small sound volume, and has disadvantages not sufficiently used practically. This invention contemplates to eliminate this disadvantage, and has a feature that a composite plate for generating a sound is supported in a casing having an opening provided in the direction of thickness, i.e. direction of sound propagation, of the composite plate, and a reflecting plate for reflecting the sound is provided at the rear surface side. Another feature of the present invention is that the above reflecting plate is formed in horn shape to further amplify the generated sound. This invention thus provides an acoustic device for generating large volume with compact structure and less power of consumption.

4 Claims, 8 Drawing Figures

FIG. 1
PRIOR ART
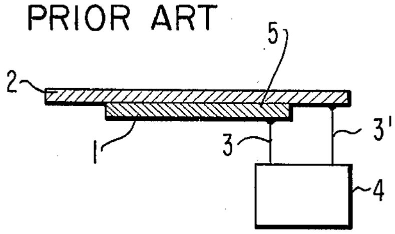
FIG. 2
PRIOR ART
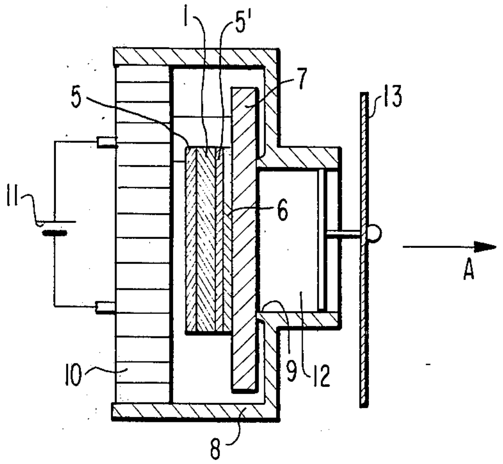
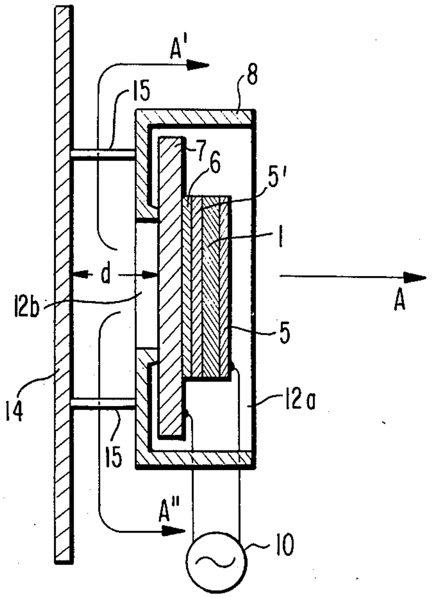
FIG. 3
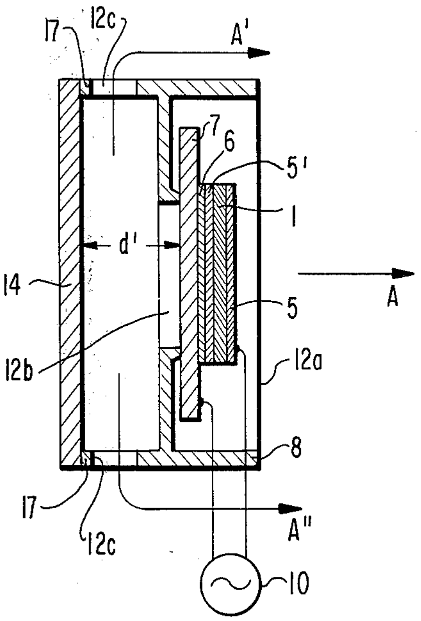
FIG. 4

FIG. 5
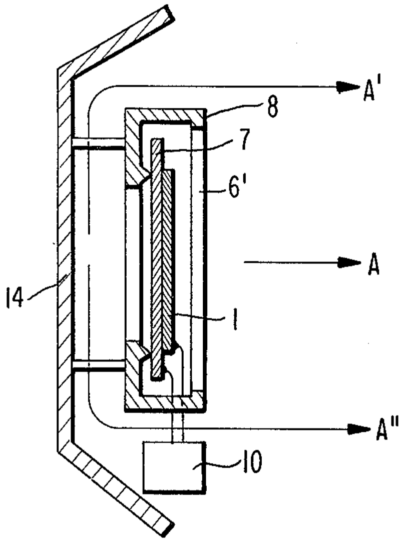
FIG. 6
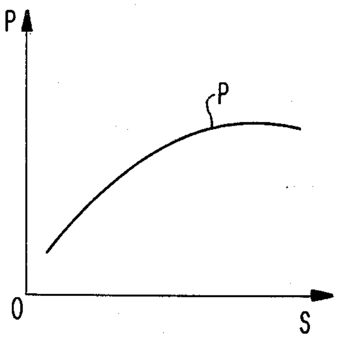
FIG. 7a
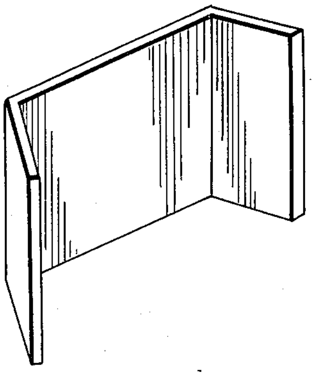
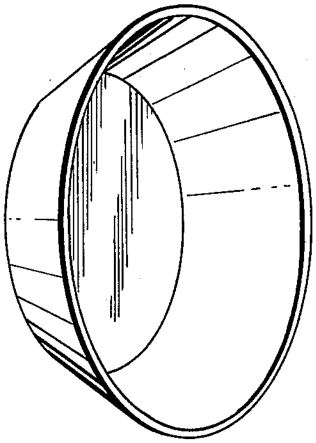
FIG. 7b

PIEZOELECTRIC ACOUSTIC DEVICE

BACKGROUND OF THE INVENTION

This invention relates to a piezoelectric acousitc device used for the warning buzzers of a fire alarm, a theft alarm, a gas detector, or interphone, or general bell, buzzer for watch, etc.

The piezoelectric acoustic device uses a piezoelectric sound generating device, and as shown in FIG. 1, the principle of the piezoelectric sound generating device is such that a piezoelectric element 1 and a vibrating plate 2 are adhered integrally to form a composite plate 5, and the piezoelectric element 1 and vibrating plate 2 of the composite plate 5 are connected to an electric circuit 4 by lead wires 3 and 3' to bend to vibrate the composite plate 5 so as to generate a sound. FIG. 2 shows the conventional piezoelectric sound generating device using this principle. A metal vibrating plate 7 is adhered to either one of silver electrodes 5 and 5' on the front and back of the piezoelectric element 1 by an adhesive 6 so as to form a composite plate. This composite plate is supported in the casing 8 by the nodes 9 of the vibration. This casing 8 is opened at the front side in the direction of thickness of the vibrating plate 7, and is closed at the rear surface by an oscillating circuit 10, and the metal vibrating plate 7 and one electrode 5 are connected to the respective oscillating circuits 10. Numeral 11 represents a power supply of the oscillating circuit 10. Therefore, if an intermittent current is applied from the power supply 11 through the oscillating circuit 10 to the piezoelectric element 1, the composite plate composed of the piezoelectric element 1, vibrating plate 7, and electrodes 5 and 5' is bent to vibrate so that a sound is generated from the opening 12 of the front surface of the casing 8 toward an arrow A.

However, since the rear surface of the casing 8 is closed by the oscillating circuit 10 in this device, the sound generated at the rear side of the composite plate cannot be fed out of the casing 8, and the sound can only be generated from the opening 12 of the front surface of the casing 8, and accordingly only a small sound volume can be obtained. It is considered that a resonant plate 13 is provided at the front of the opening 12 so as to amplify the generated volume still, but large volume cannot be obtained.

The present invention contemplates to eliminate the above disadvantages of the conventional piezoelectric acoustic device, and to provide a novel and improved piezoelectric acoustic device.

It is an object of the present invention to provide a piezoelectric acoustic device which generates a large sound volume with less power of consumption.

According to one aspect of the present invention, there is provided a piezoelectric acoustic device which comprises a composite plate having a piezoelectric element and a vibrating plate integrally adhered to each other, an electric circuit connected to the composite plate so that the composite plate is bent to generate a sound, and a casing for supporting the composite plate and having openings formed at the front and rear surface sides in the direction of thickness of the composite plate.

These and other objects, features and advantages of the present invention will become more apparent from the following description taken in conjunction with the accompanying drawings, in which:

FIG. 1 is a sectional view showing the principle of the piezoelectric acoustic device;

FIG. 2 is a sectional view of the conventional piezoelectric sound generating device;

FIGS. 3 to 5 are sectional views showing one embodiment of the piezoelectric acoustic device according to the present invention;

FIG. 6 is a graph showing the relationship between the area of the reflecting plate and the volume; and FIGS. 7a and 7b are views perspective of exemplified shapes of reflecting plates used in the device of the present invention.

Reference is now made to the drawings, particularly to FIG. 3, which shows one embodiment of the piezoelectric acoustic device according to the present invention.

A metal vibrating plate 7 is adhered to either one of silver electrodes 5 and 5' of the front and rear surfaces of the piezoelectric element 1 by an adhesive 6 so as to form a composite plate, and the vibrating plate 7 and the silver electrode 5 of the composite plate are connected to the respective oscillating circuits 10. The composite plate is contained in a casing 8 having openings 12*a* and 12*b* at the front and rear surfaces in the direction of thickness of the composite plate, i.e. in the direction of sound propagation, and the vibrating plate 7 of the composite plate is adhered to both ends of the opening 12*b* of the rear surface of the casing 8, and is thereby mounted to the casing 8. Numeral 14 represents sound reflecting plates provided at a constant distance at the rear of the casing 8 and mounted thereto by rods 15.

In operation of the thus constructed device of this embodiment, if an electric current flows in the oscillating circuit 10 so that the composite plate is bent to be vibrated, the generated sound advances in the direction of an arrow A from the opening 12*a* of the front surface of the casing 8 and at the same time collides with the reflecting plate 14 from the opening 12*b* of the rear surface of the casing 8, and reflects at the reflecting plate 14 and resonates to advance toward arrows A' and A'' of the same direction as that A so that both are superimposed, and accordingly the volume of the sound becomes large. The piezoelectric composite plate generates sound by the resonance, and since its frequency characteristics are sharp, when the reflecting plates 14 are provided at a predetermined distance *d*, remarkable amplifying effect is obtained.

The following table shows the comparison of the volume of sound by dB of the above embodiment of the device of the present invention with that of the conventional device at 1m from the front surface, when a composite plate is formed by the vibrating plate made of phosphorus bronze plate of 50mm in diameter and 0.5mm in thickness and the piezoelectric element made of zirconic acid, titanic acid, and lead of 35mm in diameter and 0.5mm in thickness, and a silver electrode, and the applied voltage at no load is 24 Vp-p;

Table

| | |
|---|---|
| Conventional device (without resonant plate 13) | 83 dB |
| Conventional device (with resonant plate 13) | 88 dB |
| Present device (Embodiment shown in FIG. 3) | 92 dB |

The piezoelectric sound generating device of this invention is mostly used by being mounted onto other equipment or a wall in fact, and in this case, even if the equipment panel or wall surface used in the device is used instead of the reflecting plate 14, similar effect and operation to those of the above embodiment may be obtained. If the conventional resonant plate and the reflecting plate of the invention are used together, the volume may be further amplified. The reflecting plate may be provided in the casing. FIG. 4 shows this embodiment, wherein the same numerals represent the same parts as those in FIG. 3. There is provided support 17 projecting at the rear surface side from the opening 12*b* of the rear surface side of the casing 8, which support has a reflecting plate 14 provided thereat. The supports have many openings 12*c* so that the sound at the rear surface side of the composite plate collides with the reflecting plate 14 to flow toward A' A'' from the openings 12*c* to increase the volume of sound.

As the foregoing description, according to the device of this invention, since the composite plate is mounted in the casing 8 having openings 12*a* and 12*b* at the front and rear surfaces and utilizes the sound generated at both surfaces of the composite plate, the volume of sound is enlarged.

However, there is the relationship as shown in FIG. 6 between the area S of the reflecting plate 14 and the volume P of sound at the front, and there is a tendency that if the area S is not increased, the volume of sound becomes small, and the distance d between the casing 8 and the reflecting plate becomes large. Experimentally, in order to perform by 100% the effect of the reflecting plate, the area S must be enlarged over approximately six times the area of the composite plate, and if the panel and wall surface are not utilized overall the device becomes large to introduce a problem.

In order to eliminate this problem, the present inventon is further improved as shown in another embodiment in FIG. 5, wherein the numerals represent the same parts as those in FIG. 3, and wherein the shape of the reflecting plate 14 is different from that in FIG. 3. More particularly, the reflecting plate 14 is enlarged toward the front of the composite plate. In principle, it is the same as that shown in FIG. 3, but the shape for reflection is improved. Concretely, as shown in FIG. 7*a*, both ends of the flat plate are bent, as shown in FIG. 7*b*, the plate has a conical shape, but the conical or horn shape is slightly improved in effect as compared to the shape shown in FIG. 7*a*.

The comparison of the device shown in FIG. 3 with the device shown in FIG. 5 using the reflecting plate in FIG. 7*a* will now be described.

When the piezoelectric element of zirconic acid, titanic acid, lead of 35mm in diameter and 0.5mm in thickness, and the vibrating plate made of phosphorus bronze of 50mm in diameter and 0.5mm in thickness are integrated to form the composite plate, the volume of both are 97 to 98 dB at the distance of 1m from the front of the plate, but the device of the invention is more compact being approximately only one-fourth the size of a prior art type buzzer.

As above, according to the present invention, it may be lessened by forming the shape of the reflecting plate to horn shape expanded toward the front surface of the plate.

I claim:

1. In a piezoelectric acoustic device including a planar piezoelectric element mounted in a housing, means for electrically energizing said element to cause mechanical vibration thereof to produce sound waves propagating in opposite directions substantially perpendicular to the plane of said piezoelectric element toward opposite ends of said housing, the housing having a first opening in one end thereof for passing sound waves propagating in one of said directions, the improvement comprising:

a. a second opening in the other end of said housing for passing sound waves propagating in the other of said directions, and b. reflector means spaced from said housing for reflecting the sound waves passing through said second opening to cause them to progagate outside of said housing in said one direction and reinforce the sound waves passing through said first opening.

2. The improvement as defined in claim 1 wherein said reflector means is a flat reflector plate mounted on said housing and spaced therefrom opposite said second opening, the plane of said plate being substantially parallel to the plane of said planar piezoelectric element.

3. The improvement as defined in claim 2 wherein said flat reflector plate has flanges fixed to opposite edges thereof, said flanges being divergent in said one direction.

4. The improvement as defined in claim 2 wherein said reflector plate is circular and has a horn-shaped flange fixed to the periphery and diverging in said one direction.

* * * * *